(12) United States Patent
Takagi

(10) Patent No.: US 7,598,807 B2
(45) Date of Patent: Oct. 6, 2009

(54) DIFFERENTIAL AMPLIFIER CIRCUIT, VOLTAGE REGULATOR USING THE DIFFERENTIAL AMPLIFIER CIRCUIT, AND METHOD FOR CONTROLLING THE DIFFERENTIAL AMPLIFIER CIRCUIT

(75) Inventor: Yoshiki Takagi, Takarazuka (JP)

(73) Assignee: Ricoh Company, Ltd., Tokyo (JP)

( * ) Notice: Subject to any disclaimer, the term of this patent is extended or adjusted under 35 U.S.C. 154(b) by 78 days.

(21) Appl. No.: 11/896,630

(22) Filed: Sep. 4, 2007

(65) Prior Publication Data
US 2008/0061881 A1    Mar. 13, 2008

(30) Foreign Application Priority Data
Sep. 8, 2006    (JP) ............................... 2006-244424

(51) Int. Cl.
*H03F 3/45*    (2006.01)
*H03F 1/14*    (2006.01)

(52) U.S. Cl. ......................................... 330/261; 330/51

(58) Field of Classification Search .................. 330/51, 330/261; 323/314
See application file for complete search history.

(56) References Cited

U.S. PATENT DOCUMENTS
7,323,932 B2 *    1/2008    Matsushita .................. 330/253

FOREIGN PATENT DOCUMENTS
JP    2002-312043    10/2002

* cited by examiner

*Primary Examiner*—Steven J Mottola
(74) *Attorney, Agent, or Firm*—Dickstein Shapiro LLP

(57) ABSTRACT

A differential amplifier circuit, a voltage regulator using the differential amplifier circuit, and a method for controlling the differential amplifier circuit. The circuit includes a differential pair having a plurality of transistors, a first bias current generator circuit part to generate a first bias current to the differential pair, and a first bias current control circuit part to control a supply of the first bias current to the differential pair in response to a switching signal from outside, wherein the first bias current generator circuit part changes a current value of the first bias current in response to the switching signal.

16 Claims, 3 Drawing Sheets

US 7,598,807 B2

DIFFERENTIAL AMPLIFIER CIRCUIT, VOLTAGE REGULATOR USING THE DIFFERENTIAL AMPLIFIER CIRCUIT, AND METHOD FOR CONTROLLING THE DIFFERENTIAL AMPLIFIER CIRCUIT

CROSS-REFERENCE TO RELATED APPLICATION

This patent application claims priority from Japanese Patent Application No. 2006-244424 filed on Sep. 8, 2006 in the Japan Patent Office, the entire contents of which are hereby incorporated by reference herein.

BACKGROUND

1. Field of the Invention

This patent specification relates to a differential amplifier circuit, a voltage regulator using the differential amplifier circuit, and a method for controlling the differential amplifier circuit, and more particularly, to a differential amplifier circuit for use in a voltage regulator having low current consumption and capable of quickly switching from a non-operating state to an operating state.

2. Discussion of Related Art

The circuit configuration of voltage regulators is typified into two types: One that consumes a large amount of current to improve power-supply rejection ratio (PSRR) and load transient response, and another that does not have to respond at high speed and thus can reduce current consumption. When a high speed response voltage regulator is employed in, for example, a cellular phone that has an operating mode and a stand-by mode, i.e., a sleep mode, which does not require a high speed response, the current consumption in the stand-by mode results in a great waste.

FIG. 1 is a diagram illustrating an example circuit of a typical voltage regulator 100. The voltage regulator 100 includes a first error amplifier circuit 110 and a second error amplifier circuit 120. The first error amplifier circuit 110 that is required to respond at high speed to fluctuation in an output voltage $V_{out}$ operates in a high-load operating mode in which the amount of current output from an output terminal 101 is large. The second error amplifier circuit 120 that is not required to respond at high speed to fluctuation in the output voltage $V_{out}$ operates in a low-load operating mode, in which the amount of current output from the output terminal 101 is small as in a wait state. Control signals are provided by an external controller to select between the first error amplifier circuit 110 and the second error amplifier circuit 120 and control switching of changeover switches SW1, SW2 and SW3. Each of the changeover switches SW1 to SW3 is connected to a point a in the high-load operating mode and is connected to a point b in the low-load operating mode. A reference voltage $V_{ref}$ is applied to the first error amplifier circuit 110 and the second error amplifier circuit 120.

In the high-load operating mode, a bias voltage VA is applied to each gate of NMOS transistors M106 and M107 included in the first error amplifier circuit 110 via the changeover switch SW1. A bias current is supplied to the first error amplifier circuit 110 and the first error amplifier circuit 110 starts operating. On the other hand, since the gate of a NMOS transistor M115 functioning as a bias current generator transistor for the second error amplifier circuit 120 is grounded by the changeover switch SW2 and the NMOS transistor M115 is short-circuited between the gate and the source thereof, a bias current is not generated therein and the second error amplifier circuit 120 stops operating.

In the low-load operating mode, the bias voltage VA is applied to the gate of the NMOS transistor M115 in the second error amplifier circuit 120 via the changeover switch SW2. A bias current is supplied to the second error amplifier circuit 120 and the second error amplifier circuit 120 starts operating. On the other hand, since each gate of the NMOS transistors M106 and M107 functioning as a bias current generator transistor for the first error amplifier circuit 110 is grounded by the changeover switch SW1 and each of the NMOS transistors M106 and M107 is short-circuited between the gate and the source thereof, a bias current is not generated therein and the first error amplifier circuit 110 stops operating. Further, a PMOS transistor M103 that is connected between a power supply voltage VDD and the NMOS transistor M107 is short-circuited between the gate and the source thereof by the changeover switch SW3, which ensures that the first error amplifier circuit 110 stops operating. Thus, the current consumption is reduced in the low-load operating mode, which does not require a high speed response and in which the amount of current is small as in a wait state.

When the operating mode is switched from the low-load operating mode to the high-load operating mode, the changeover switch SW1 is switched from the point b to the point a, the bias voltage VA is applied to each gate of the NMOS transistors M106 and M107, and the bias current begins to be supplied to the first error amplifier circuit 110. However, since each gate of the NMOS transistors M106 and M107 is short-circuited by the changeover switch SW1 until just before the switching, the gate voltage is zero.

A MOS transistor has a gate capacitance between the gate and the source thereof. Therefore, when the changeover switch SW1 is switched from the point b to the point a and the bias voltage VA is applied to each gate of the NMOS transistors M106 and M107, each gate voltage of the NMOS transistors M106 and M107 does not immediately reach the bias voltage VA and it takes time to charge each gate capacitance of the NMOS transistors M106 and M107. Therefore, immediately after the operating mode is switched from the low-load operating mode to the high-load operating mode, the bias current in the first error amplifier circuit 110 is insufficient, which causes the output voltage $V_{out}$ to drop for a moment. The same problem also occurs when the operating mode is switched from the high-load operating mode to the low-load operating mode.

SUMMARY

This patent specification describes a novel differential amplifier circuit that includes a differential pair having a plurality of transistors, a first bias current generator circuit part to generate a first bias current to the differential pair, and a first bias current control circuit part to control a supply of the first bias current to the differential pair in response to a switching signal from outside. The first bias current generator circuit part changes a current value of the first bias current in response to the switching signal.

This patent specification further describes a novel voltage regulator that includes at least one output transistor to output a current from an input terminal to an output terminal according to an input control signal, and a control circuit part having a plurality of differential amplifier circuits to amplify and output a voltage difference between a proportional voltage proportional to an output voltage output from the output terminal and a reference voltage and start and stop operating in response to a switching signal from outside. The control circuit part controls operation of the output transistor so that the proportional voltage is equal to the reference voltage. At least one of the differential amplifier circuits has a differential pair including a plurality of transistors, a first bias current generator circuit part to generate a first bias current to the differential pair, and a first bias current control circuit part to control a supply of the first bias current to the differential pair in response to the switching signal. The first bias current generator circuit part changes a current value of the first bias current in response to the switching signal.

This patent specification further describes a novel method for controlling a differential amplifier circuit including, when a switching signal for starting an operation of the differential amplifier circuit is input, supplying a bias current having a first value from a constant current source to a differential pair, and, when a switching signal for stopping the operation of the differential amplifier circuit is input, blocking the supply of the bias current from the constant current source to the differential pair and generating a bias current having a second value greater than the first value.

This patent specification further describes a novel method for controlling a differential amplifier circuit including, when a switching signal for starting an operation of the differential amplifier circuit is input, supplying a first bias current having a first value from a first constant current source to a differential pair and a second bias current having a third value from a second constant current source to an amplification transistor having a control electrode to which an output signal of a differential amplifier circuit part is input, and, when a switching signal for stopping the operation of the differential amplifier circuit is input, blocking the supply of the first bias current from the first constant current source to the differential pair and the supply of the second bias current from the second constant current source to the amplification transistor and generating a first bias current having a second value greater than the first value and a second bias current having a fourth value greater than the third value.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
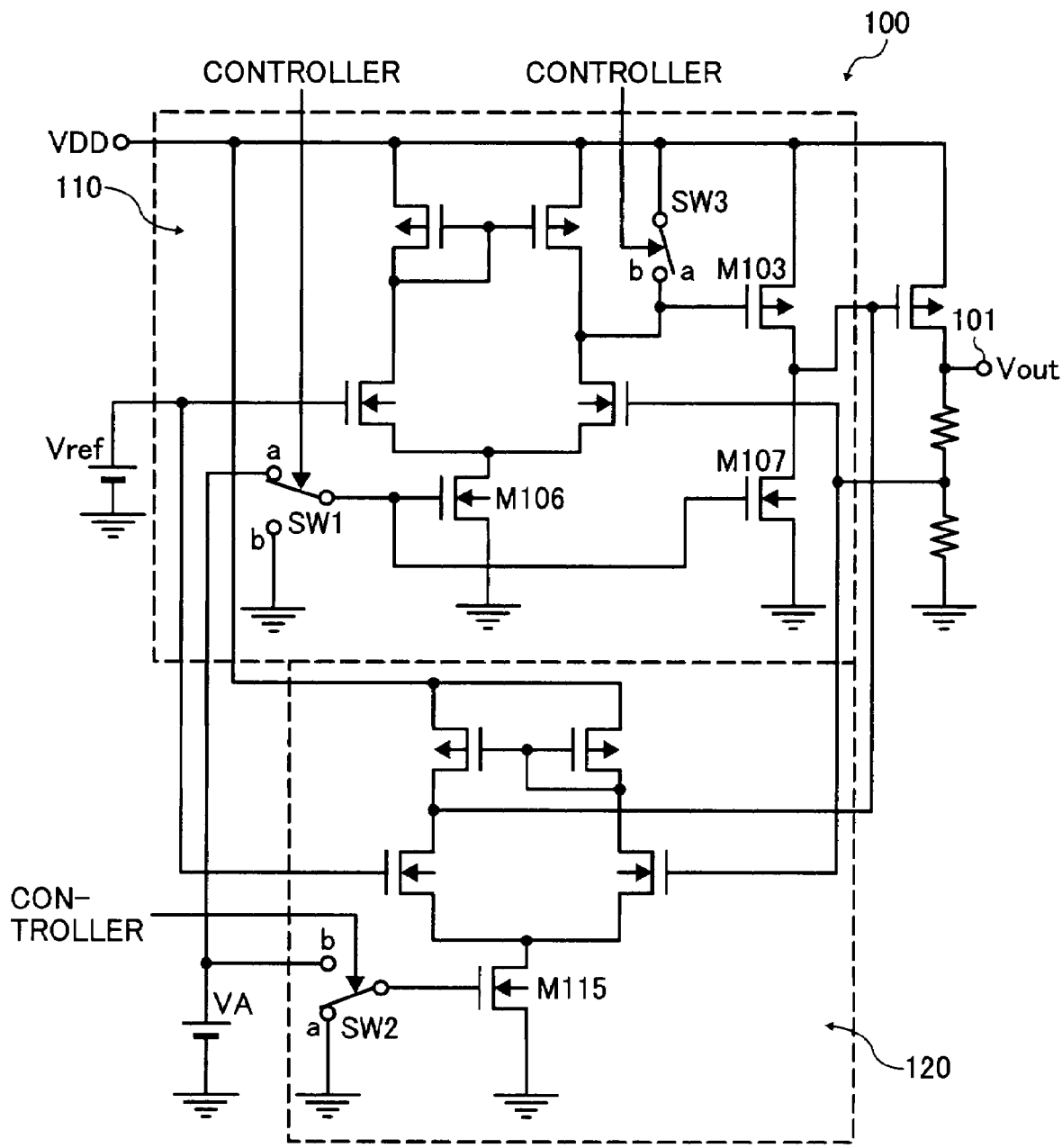
FIG. 1 is a diagram illustrating an example circuit of a typical voltage regulator.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referring now to the drawings, wherein like reference numerals designate identical or corresponding parts throughout the several views, a differential amplifier circuit according to an example embodiment is described.

Figure 2:
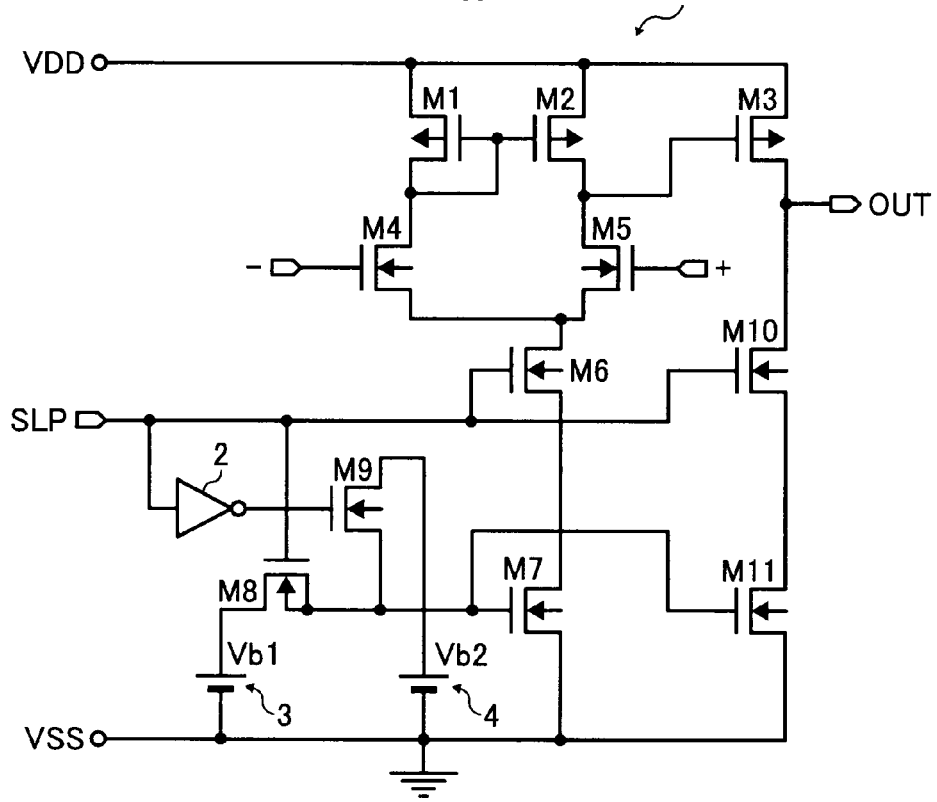
FIG. 2 is a diagram illustrating a differential amplifier circuit according to one embodiment of the present invention.

FIG. 2 is a diagram illustrating an example of a differential amplifier circuit 1 according to one embodiment of the present invention.

In FIG. 2, the differential amplifier circuit 1 includes PMOS transistors M1 to M3, NMOS transistors M4 to M11, an inverter 2, a first bias voltage generator circuit 3 for generating and outputting a first bias voltage Vb1, and a second bias voltage generator circuit 4 for generating and outputting a second bias voltage Vb2 that is high in comparison with the first bias voltage Vb1.

The NMOS transistors M7 to M9, the inverter 2, the first bias voltage generator circuit 3, and the second bias voltage generator circuit 4 form a first bias current generator circuit part. The NMOS transistor M6 forms a first bias current control circuit part. The NMOS transistor M7 forms a first bias current generator transistor and functions as a first constant current source. The inverter 2 and the NMOS transistors M8 and M9 form a switching circuit. The NMOS transistors M8, M9, and M11, the inverter 2, the first bias voltage generator circuit 3, and the second bias voltage generator circuit 4 form a second bias current generator circuit part. The NMOS transistor M10 forms a second bias current control circuit part. The PMOS transistor M3 forms an amplification transistor. The NMOS transistor M11 forms a second bias current generator transistor and functions as a second constant current source.

The NMOS transistors M4 and M5 form a differential pair and the sources thereof are connected to each other. The NMOS transistors M6 and M7 are connected in series between the junction of the NMOS transistors M4 and M5 and a ground voltage, or a power supply voltage VSS. The gate of the NMOS transistor M4 functions as an inverting input terminal − and the gate of the NMOS transistor M5 functions as a non-inverting input terminal +. The NMOS transistor M8 is connected between the gate of the NMOS transistor M7 and the first bias voltage Vb1. The NMOS transistor M9 is connected between the gate of the NMOS transistor M7 and the second bias voltage Vb2. A switching signal SLP is input from outside to each gate of the NMOS transistors M6 and M10. The inverter 2 inverts a signal level of the switching signal SLP and the inverted signal is input to the gate of the NMOS transistor M9.

Either the first bias voltage Vb1 or the second bias voltage Vb2 is applied to the gate of the NMOS transistor M7. The NMOS transistor M7 forms the first constant current source for supplying a constant current to the NMOS transistors M4 and M5.

The PMOS transistors M1 and M2 form a current mirror circuit and function as a load for the differential pair, i.e., the NMOS transistors M4 and M5. The PMOS transistor M1 is connected between a power supply voltage VDD and the drain of the NMOS transistor M4. The PMOS transistor M2 is connected between the power supply voltage VDD and the drain of the NMOS transistor M5. The gates of the PMOS transistors M1 and M2 are connected to each other and the junction thereof is connected to the drain of the PMOS transistor M1. The PMOS transistor M3 and the NMOS transistors M10 and M11 are connected in series between the power supply voltage VDD and the ground voltage. The junction of the PMOS transistor M3 and the NMOS transistor M10 functions as the output terminal of the differential amplifier circuit 1.

The gate of the PMOS transistor M3 is connected to the junction of the PMOS transistor M2 and the NMOS transistor M5. The junction of the PMOS transistor M2 and the NMOS transistor M5 functions as the output terminal of a differential amplifier stage.

The switching signal SLP is input to the gate of the NMOS transistor M10. The gate of the NMOS transistor M11 is connected to the gate of the NMOS transistor M7. Thus, the NMOS transistor M11 functions as a constant current load for the PMOS transistor M3.

The NMOS transistors M6, M8, M9, and M10 function as a switching transistor that performs switching in response to the switching signal SLP.

The second bias voltage Vb2 is set to be high in comparison with the first bias voltage Vb1 in the configuration described above. During a normal operation, the switching signal SLP is high, each of the NMOS transistors M6, M8, and M10 is turned on for conduction, and the NMOS transistor M9 is turned off and cut off. When the NMOS transistor M8 is turned on, the first bias voltage Vb1 is applied to each gate of the NMOS transistors M7 and M11. Each of, the NMOS transistors M7 and M11 generates a constant drain current based on the first bias voltage Vb1. The drain current generated by the NMOS transistor M7 is supplied as a bias current to the differential pair through the NMOS transistor M6. The drain current generated by the NMOS transistor M11 is supplied as a bias current to the PMOS transistor M3 through the NMOS transistor M10. Thus, the differential amplifier circuit 1 is set in an operating state.

Next, when the operation of the differential amplifier circuit 1 is stopped to stop current consumption, as in a sleep mode, the switching signal SLP is changed to low. In this case, each of the NMOS transistors M6, M8, and M10 is turned off and cut off, and the NMOS transistor M9 is turned on for conduction.

When the NMOS transistor M9 is turned on, the second bias voltage Vb2 is applied to the gate of the NMOS transistor M7. The NMOS transistor M7 generates a constant drain current based on the second bias voltage Vb2 to supply the drain current as the bias current to the differential pair. However, since the NMOS transistor M6 is turned off, the bias current supply to the differential pair stops. Similarly, the NMOS transistor M11 generates a constant drain current based on the second bias voltage Vb2 to supply the drain current as the bias current to the PMOS transistor M3. However, since the NMOS transistor M10 is turned off, the bias current supply to the PMOS transistor M3 stops. As a result, the differential amplifier circuit 1 stops operating.

When the switching signal SLP changes from low to high, each gate voltage of the NMOS transistors M7 and M11 changes back to the first bias voltage Vb1 from the second bias voltage Vb2. Since the second bias voltage Vb2 is high in comparison with the first bias voltage Vb1, each gate capacitance of the NMOS transistors M7 and M11 does not need to be charged. Therefore, a bias current is supplied from each of the NMOS transistors M7 and M11 instantly.

Thus, when the differential amplifier circuit 1 starts operating with the switching signal SLP, each gate capacitance of the NMOS transistors M7 and M11 does not need to be charged, and each of the NMOS transistors M7 and M11 instantly supplies a bias current. Therefore, it is possible to quickly operate the differential amplifier circuit 1.

Figure 3:
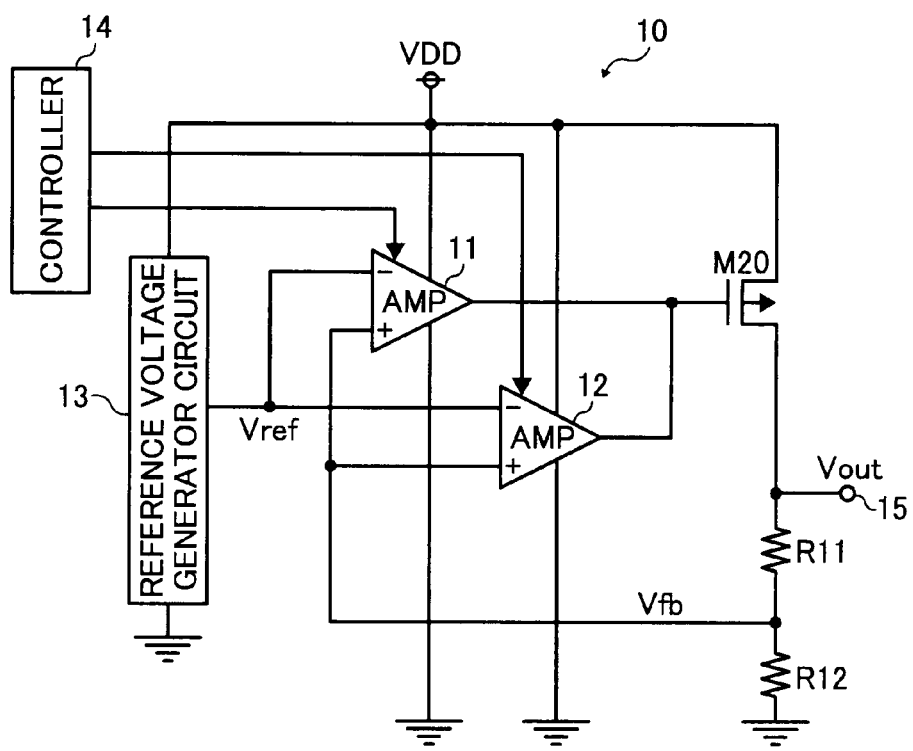
FIG. 3 is a diagram illustrating an example circuit of a voltage regulator using the differential amplifier circuit of FIG. 2.

FIG. 3 is a diagram illustrating an example circuit of a voltage regulator 10 using the differential amplifier circuit 1 of FIG. 2.

In FIG. 3, the voltage regulator 10 includes a first error amplifier circuit 11 that consumes a large amount of current but can operate at high speed and a second error amplifier circuit 12 in which current consumption is reduced. A controller 14 inputs control signals to each of the first error amplifier circuit 11 and the second error amplifier circuit 12. The operations of the first error amplifier circuit 11 and the second error amplifier circuit 12 are exclusive to each other in response to the control signals. Each of the first error amplifier circuit 11 and the second error amplifier circuit 12 includes the differential amplifier circuit 1 of FIG. 2. When operation is stopped, current consumption is reduced.

In a high-load operating mode in which a large amount of current is output from an output terminal 15, when the first error amplifier circuit 11 starts operating, the second error amplifier circuit 12 stops operating. As a result, the first error amplifier circuit 11 controls the operation of an output transistor M20 so that a divided voltage $V_{fb}$ that is obtained by dividing an output voltage $V_{out}$ between resistors R11 and R12 is equal to a reference voltage $V_{ref}$ applied by a reference voltage generator circuit 13. Thus, the output transistor M20 is controlled by the first error amplifier circuit 11, and therefore the voltage regulator 10 can operate at high speed while consuming a large amount of current.

In a low-load operating mode in which a small amount of current is output from the output terminal 15, when the first error amplifier circuit 11 stops operating, the second error amplifier circuit 12 starts operating. As a result, the second error amplifier circuit 12 controls the operation of the output transistor M20 so that the divided voltage $V_{fb}$ is equal to the reference voltage $V_{ref}$. Thus, the output transistor M20 is controlled by the second error amplifier circuit 12, and therefore the voltage regulator 10 can reduce the current consumption.

When the voltage regulator 10 switches from the high-load operating mode to the low-load operating mode or vice versa, the error amplifier circuit in a non-operating state starts operating. In this case, a sufficient bias voltage is already applied to the gates of the NMOS transistors M7 and M11 for supplying a bias current to the error amplifier circuit in the non-operating state. As described above with reference to FIG. 2, the error amplifier circuit in the non-operating state can quickly start operating because each gate capacitance of the NMOS transistors M7 and M11 is already charged, i.e., does not need to be charged. Therefore, fluctuation in the output voltage $V_{out}$ when switching between operating modes can be considerably reduced.

Figure 4:
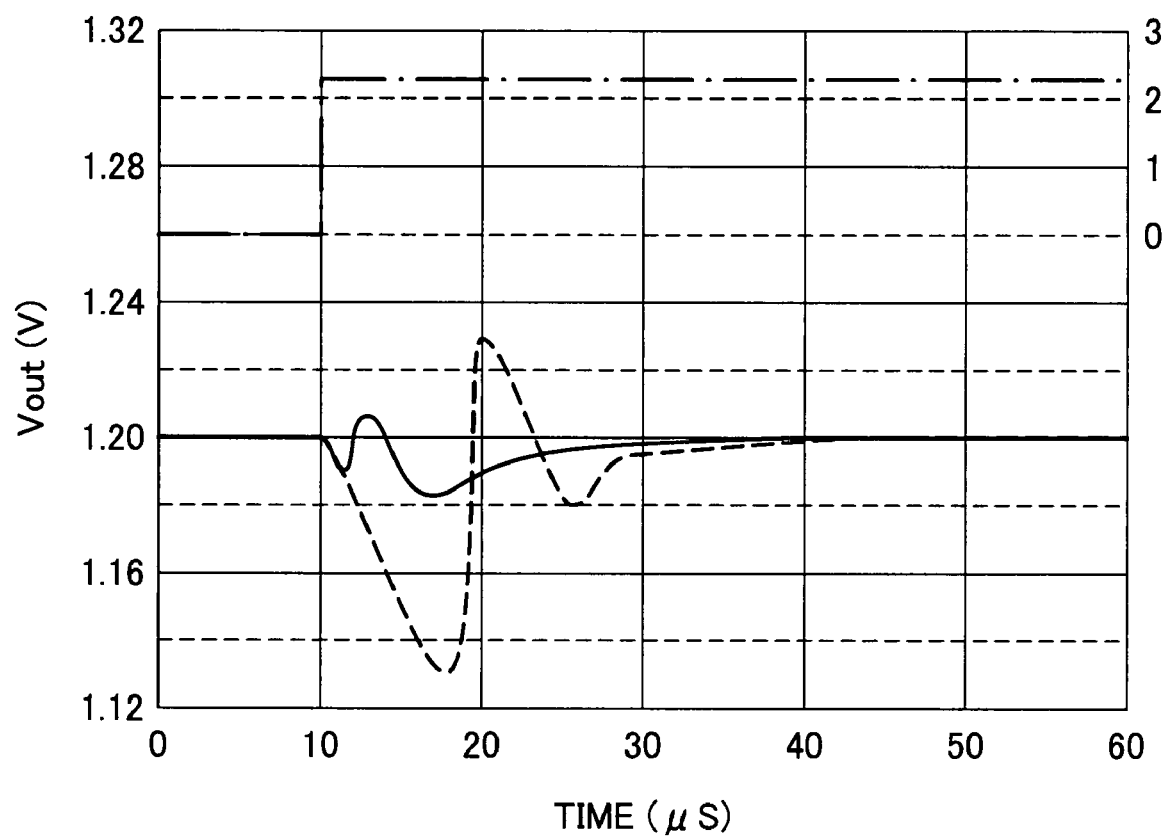
FIG. 4 is a graph illustrating an example waveform of an output voltage of FIG. 3.

FIG. 4 illustrates an example waveform of the output voltage $V_{out}$ when the voltage regulator 10 is switched from the low-load operating mode to the high-load operating mode. In FIG. 4, the long dashed dotted line represents the control signal SLP, the continuous line represents the output voltage $V_{out}$ of the voltage regulator 10 according to the example embodiment of the present invention, and the dashed line indicates an output voltage of a typical voltage regulator. As can be seen in FIG. 4, changes in the output voltage $V_{out}$ when switching the operating mode is considerably reduced. It should be noted that FIG. 4 illustrates an example in which the output voltage $V_{out}$ is 1.2 V, the power supply voltage VDD is 2.2 V, an external capacitance is 1 μF, and a load current output from the output terminal 15 is 10 mA.

Although in FIG. 3 the differential amplifier circuit 1 of FIG. 2 is used for both of the first error amplifier circuit 11 and the second error amplifier circuit 12, alternatively the differential amplifier circuit 1 may be used only for one of the first error amplifier circuit 11 and the second error amplifier circuit 12.

According to the above-described example embodiment of the present invention, when the differential amplifier circuit 1 starts operating with the switching signal SLP, the first bias voltage Vb1 is applied to the gate of the NMOS transistor M7 functioning as a constant current source for supplying a bias current to the differential amplifier stage and to the gate of the NMOS transistor M11 functioning as a constant current source for supplying a bias current to the following amplifier stage. When the differential amplifier circuit 1 stops operating according to the switching signal SLP, the second bias voltage Vb2 that is high in comparison with the first bias voltage Vb1 is applied to each gate of the NMOS transistors M7 and M11. Therefore, the differential amplifier circuit 1 can quickly start operating with the control signal SLP. In addition, by using the two error amplifier circuits, i.e., the first error amplifier circuit 11 and the second error amplifier circuit 12 that both include the differential amplifier circuit 1, the voltage regulator 10 can reduce the changes in the output voltage $V_{out}$ when switching from the high-load operating mode to the low-load operating mode or vice versa by switching the differential amplifier circuits 1.

As can be understood by those of skill in the art, numerous additional modifications and variations are possible in light of the above teachings. It is therefore to be understood that, within the scope of the appended claims, the disclosure of this patent specification may be practiced otherwise than as specifically described herein.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program or computer program product. For example, the aforementioned methods may be embodied in the form of a system or device, including, but not limited to, any of the structures for performing the methodology illustrated in the drawings.

Even further, any of the aforementioned methods may be embodied in the form of a program. The program may be stored on a computer-readable medium and adapted to perform any one of the aforementioned methods when run on a computer device (a device including a processor). The program may include computer-executable instructions for carrying out one or more of the steps above, and/or one or more of the aspects of the invention. Thus, the storage medium or computer-readable medium, is adapted to store information and is adapted to interact with a data processing facility or computer device to perform the method of any of the above mentioned embodiments.

The storage medium may be a built-in medium installed inside a computer device main body or a removable medium arranged so that it can be separated from the computer device main body. Examples of the built-in medium include, but are not limited to, rewriteable non-volatile memories, such as ROMs and flash memories, and hard disks. Examples of the removable medium include, but are not limited to, optical storage media such as CD-ROMs and DVDs; magneto-optical storage media, such as MOs; magnetic storage media, including but not limited to floppy disks (trademark), cassette tapes, and removable hard disks; media with a built-in rewriteable non-volatile memory, including but not limited to memory cards; and media with a built-in ROM, including but not limited to ROM cassettes, etc. Furthermore, various information regarding stored images, for example, property information, may be stored in any other form, or provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A differential amplifier circuit, comprising:
a differential pair comprising a plurality of transistors;
a first bias current generator circuit part configured to generate a first bias current and provide a constant current source to the differential pair; and
a first bias current control circuit part configured to control a supply of the first bias current to the differential pair in response to a switching signal from outside,
wherein the first bias current generator circuit part changes a current value of the first bias current in response to the switching signal such that said first bias current generator circuit part generates a first bias current having a first value or a second value in response to said switching signal.

2. The differential amplifier circuit according to claim 1, wherein, when a switching signal for supplying the first bias current to the differential pair is input to the first bias current control circuit part, the first bias current generator circuit part generates the first bias current having the first value, and, when a switching signal for stopping the supply of the first bias current to the differential pair is input to the first bias current control circuit part, the first bias current generator circuit part generates the first bias current having the second value, wherein the second value is greater than the first value.

3. The differential amplifier circuit according to claim 2, wherein the first bias current generator circuit part comprises:
a first bias current generator transistor configured to generate the first bias current based on a bias voltage applied to a control electrode thereof;
a first bias voltage generator circuit configured to generate a first bias voltage for the first bias current generator transistor to generate the first bias current having the first value;
a second bias voltage generator circuit configured to generate a second bias voltage for the first bias current generator transistor to generate the first bias current having the second value; and
a switching circuit configured to apply one of the first bias voltage and the second bias voltage to the control electrode of the first bias current generator transistor in response to the switching signal.

4. The differential amplifier circuit according to claim 3, wherein the switching circuit applies the first bias voltage to the control electrode of the first bias current generator transistor when the switching signal for supplying the first bias current to the differential pair is input to the first bias current control circuit part, and applies the second bias voltage to the control electrode of the first bias current generator transistor when the switching signal for stopping the supply of the first bias current to the differential pair is input to the first bias current control circuit part.

5. A differential amplifier circuit comprising:
a differential pair comprising a plurality of transistors;
a first bias current generator circuit part configured to generate a first bias current to the differential pair;
a first bias current control circuit part configured to control a supply of the first bias current to the differential pair in response to a switching signal from outside, wherein the first bias current generator circuit part changes a current value of the first bias current in response to the switching signal;
a differential amplifier circuit part comprising the differential pair and configured to amplify and output a voltage difference between signals input based on the differential pair; and an amplifier circuit part configured to amplify and output an output signal of the differential amplifier circuit part, the amplifier circuit part comprising:
- an amplification transistor comprising a control electrode to which the output signal of the differential amplifier circuit part is input;
- a second bias current generator circuit part configured to generate a second bias current to the amplification transistor; and
- a second bias current control circuit part configured to control a supply of the second bias current to the amplification transistor in response to a switching signal from outside,
- wherein the second bias current generator circuit part changes a current value of the second bias current in response to the switching signal.

6. The differential amplifier circuit according to claim 5, wherein, when a switching signal for supplying the second bias current to the amplification transistor is input to the second bias current control circuit part, the second bias current generator circuit part generates the second bias current having a third value, and, when a switching signal for stopping the supply of the second bias current to the amplification transistor is input to the second bias current control circuit part, the second bias current generator circuit part generates the second bias current having a fourth value, wherein the fourth value is greater than the third value.

7. The differential amplifier circuit according to claim 6, wherein the second bias current generator circuit part comprises a second bias current generator transistor comprising a control electrode connected to a control electrode of a first bias current generator transistor, and configured to generate the second bias current based on a voltage applied to the control electrode of the second bias current generator transistor.

8. A voltage regulator, comprising:
at least one output transistor configured to output a current from an input terminal to an output terminal according to an input control signal; and
a control circuit part comprising a plurality of differential amplifier circuits configured to amplify and output a voltage difference between a proportional voltage proportional to an output voltage output from the output terminal and a reference voltage and start and stop operating in response to a switching signal from outside,
the control circuit part configured to control an operation of the output transistor so that the proportional voltage is equal to the reference voltage,
at least one of the differential amplifier circuits comprising:
- a differential pair comprising a plurality of transistors;
- a first bias current generator circuit part configured to generate a first bias current and provide a constant current source to the differential pair; and
- a first bias current control circuit part configured to control a supply of the first bias current to the differential pair in response to the switching signal,
- wherein the first bias current generator circuit part changes a current value of the first bias current in response to the switching signal such that said first bias current generator circuit part generates the first bias current having a first value or a second value in response to said switching signal.

9. The voltage regulator according to claim 8, wherein, when a switching signal for supplying the first bias current to the differential pair is input to the first bias current control circuit part, the first bias current generator circuit part generates the first bias current having the first value, and, when a switching signal for stopping the supply of the first bias current to the differential pair is input to the first bias current control circuit part, the first bias current generator circuit part generates the first bias current having the second value, wherein the second value is greater than the first value.

10. The voltage regulator according to claim 9, wherein the first bias current generator circuit part comprises:
- a first bias current generator transistor configured to generate the first bias current based on a bias voltage applied to a control electrode thereof;
- a first bias voltage generator circuit configured to generate a first bias voltage for the first bias current generator transistor to generate the first bias current having the first value;
- a second bias voltage generator circuit configured to generate a second bias voltage for the first bias current generator transistor to generate the first bias current having the second value; and
- a switching circuit configured to apply one of the first bias voltage and the second bias voltage to the control electrode of the first bias current generator transistor in response to the switching signal.

11. The voltage regulator according to claim 10, wherein the switching circuit applies the first bias voltage to the control electrode of the first bias current generator transistor when the switching signal for supplying the first bias current to the differential pair is input to the first bias current control circuit part, and applies the second bias voltage to the control electrode of the first bias current generator transistor when the switching signal for stopping the supply of the first bias current to the differential pair is input to the first bias current control circuit part.

12. A voltage regulator comprising:
at least one output transistor configured to output a current from an input terminal to an output terminal according to an input control signal; and
a control circuit part comprising a plurality of differential amplifier circuits configured to amplify and output a voltage difference between a proportional voltage proportional to an output voltage output from the output terminal and a reference voltage and start and stop operating in response to a switching signal from outside,
the control circuit part configured to control an operation of the output transistor so that the proportional voltage is equal to the reference voltage,
at least one of the differential amplifier circuits comprising:
- a differential pair comprising a plurality of transistors;
- a first bias current generator circuit part configured to generate a first bias current to the differential pair; and
- a first bias current control circuit part configured to control a supply of the first bias current to the differential pair in response to the switching signal,
- wherein the first bias current generator circuit part changes a current value of the first bias current in response to the switching signal,
- wherein the differential amplifier circuit comprises a differential amplifier circuit part comprising the differential pair and configured to amplify and output a voltage difference between signals input based on the differential pair and an amplifier circuit part configured to amplify and output an output signal of the differential amplifier circuit part, the amplifier circuit part comprising:

an amplification transistor comprising a control electrode to which the output signal of the differential amplifier circuit part is input;

a second bias current generator circuit part configured to generate a second bias current to the amplification transistor; and a second bias current control circuit part configured to control a supply of the second bias current to the amplification transistor in response to a switching signal from outside, wherein the second bias current generator circuit part changes a current value of the second bias current in response to the switching signal.

13. The voltage regulator according to claim 12, wherein, when a switching signal for supplying the second bias current to the amplification transistor is input to the second bias current control circuit part, the second bias current generator circuit part generates the second bias current having a third value, and, when a switching signal for stopping the supply of the second bias current to the amplification transistor is input to the second bias current control circuit part, the second bias current generator circuit part generates the second bias current having a fourth value greater than the third value.

14. The voltage regulator according to claim 13, wherein the second bias current generator circuit part comprises a second bias current generator transistor comprising a control electrode connected to a control electrode of a first bias current generator transistor, and configured to generate the second bias current based on a voltage applied to the control electrode of the second bias current generator transistor.

15. A method for controlling a differential amplifier circuit, comprising:

when a switching signal for starting an operation of the differential amplifier circuit is input, supplying a bias current having a first value from a constant current source to a differential pair; and when a switching signal for stopping the operation of the differential amplifier circuit is input, blocking the supply of the bias current from the constant current source to the differential pair and generating a bias current having a second value greater than the first value.

16. A method for controlling a differential amplifier circuit, comprising:

when a switching signal for starting an operation of the differential amplifier circuit is input, supplying a first bias current having a first value from a first constant current source to a differential pair and a second bias current having a third value from a second constant current source to an amplification transistor comprising a control electrode to which an output signal of a differential amplifier circuit part is input; and when a switching signal for stopping the operation of the differential amplifier circuit is input, blocking the supply of the first bias current from the first constant current source to the differential pair and the supply of the second bias current from the second constant current source to the amplification transistor, and generating a first bias current having a second value greater than the first value and a second bias current having a fourth value greater than the third value.

* * * * *